United States Patent [19]

Cox

[11] Patent Number: 4,795,975

[45] Date of Patent: Jan. 3, 1989

[54] THERMAL AND ELECTROMAGNETIC SHIELD FOR POWER METER

[75] Inventor: Ned Cox, Jonesborough, Tenn.

[73] Assignee: Texas Instruments Incorporated, Dallas, Tex.

[21] Appl. No.: 912,449

[22] Filed: Sep. 26, 1986

[51] Int. Cl.$^4$ .............................................. G01R 1/04
[52] U.S. Cl. ................................... 324/156; 361/372; 174/35 MS; 307/91
[58] Field of Search .................. 174/35 MS; 324/156, 324/157; 361/212, 216, 364, 372, 424; 307/89, 91

[56] References Cited

U.S. PATENT DOCUMENTS

| | | | |
|---|---|---|---|
| 2,288,735 | 7/1942 | O'Connell | 174/35 MS |
| 2,575,715 | 11/1951 | Keller | 324/156 |
| 2,647,235 | 7/1953 | Hogenbirk | 174/35 MS |
| 4,686,141 | 8/1987 | Burns et al. | 174/35 MS |
| 4,744,004 | 5/1988 | Hammond | 361/372 |

*Primary Examiner*—A. D. Pellinen
*Assistant Examiner*—H. L. Williams
*Attorney, Agent, or Firm*—James P. McAndrews; John A. Haug; Melvin Sharp

[57] ABSTRACT

A power meter device having a transparent part and an electronic signal transmitter to permit remote meter reading has a thermal and electromagnetic interference shield for protecting the electronic transmitter means from high temperatures and r.f. interference. The shield comprises a metal-organic laminate of black and white polyester layers bonded to respective opposite sides of an aluminum foil so a portion of the foil is exposed by the black polyester along a top edge of the laminate, so portions of the black and white polyesters extend beyond the foil and are bonded together along a bottom edge of the laminiate, to provide a slit near one strip end and an interlocking or detent flap at an opposite strip end and to provide integral ground and mounting tabs in the portion of the metal foil exposed by the black polyester. The blanked strip is formed into cylindrical configuration with the white polyester on its outer surface by fitting the detent flap into the slit; the bonding of the extending white and black polyester portions electrically isolates the bottom edge of the foil; and the tabs are secured to stud means to dispose the shield cylinder around the electronic components of the device inside the transparent housing part for thermally shielding those components and for electrically grounding the metal foil to electromagnetically shield the electronic components.

6 Claims, 1 Drawing Sheet

THERMAL AND ELECTROMAGNETIC SHIELD FOR POWER METER

BACKGROUND OF THE INVENTION

The field of the invention is that of power meter devices and the invention relates more particularly to a thermal and electromagnetic shield for a power meter device having a transparent glass or polycarbonate housing part where the device incorporates electronic components for permitting remote meter reading.

Conventional power meter devices have been extensively developed and are now achieving high efficiency and reliability over a long service life. Such devices are installed in millions of different locations including many in which the meter devices are exposed to very high temperatures and electromagnetic interference and many which are relatively remote from central power supply facilities. It has been proposed that electronic transmitter means be incorporated in such meter devices either at original installation or by retrofitting to permit remote reading of the meter devices. However many of such power meter devices have transparent glass or polycarbonate housing parts or the like to permit customer observation of device operation and to permit direct reading of visual displays provided in the existing device designs. If electronic transmitter means were to be incorporated in the existing attractive, efficient and reliable devices by retrofitting or otherwise and if electronic means were to be exposed to high temperatures and electromagnetic interference through such transparent housing parts, it would be expected that the electronic means would not provide comparable reliability and service life.

BRIEF SUMMARY OF THE INVENTION

It is an object of this invention to provide a novel and improved thermal and electromagnetic shield for a power meter device or the like; to provide such a shield which is particularly adapted to be incorporated in existing power meter devices having electronic components enclosed within transparent glass or polycarbonate housing parts to provide desired shielding while maintaining the otherwise attractive appearance of such devices; to provide such a shield which is adapted to be manufactured at low cost and to be inexpensively mounted in such power meter devices; to provide novel and improved power meter devices incorporating such shields; and to provide a novel and improved method for making such shields.

Briefly described, the thermal and electromagnetic shield of this invention comprises a metal-organic laminate which is mounted in a power meter device or the like having a transparent, preferably cylindrical, housing part of glass or of a shock-resistant organic material such as a polycarbonate or the like for enclosing electronic components in the device to thermally and electromagnetically shield the electronic components. The laminate comprises a layer of white or other light-colored, electrically-insulating, organic material such as a polyester or the like which is bonded to one side of an electrically conductive metal foil of aluminum or the like. A layer of black or other dark-colored electrically-insulating organic material such as a polyester is bonded to an opposite side of the metal foil. If desired the organic layers are bonded to the foil using intermediate adhesives but the organic materials are also directly bonded to the foil in any conventional manner by hot or cold roll or pressure bonding or the like if desired. In a preferred embodiment the foil and the organic layers are relatively thin so the laminate material is pliable with slight stiffness or flexibility to be amenable to shaping but to tend to be shape-retaining. Preferably at least one layer of the organic material such as the dark-colored material is bonded to the metal foil to leave a portion of the metal foil exposed from the organic material along a first or top edge of the laminate. Preferably the layers of the organic materials extend from the foil and are bonded to each other along an opposite or bottom edge of the laminate.

In forming the shield, the shield is blanked from a strip or length of the laminate to provide a slit in the strip means near one strip end and to provide a winged, interlock or detent flap or the like at an opposite end of the strip. The shield is also blanked to provide integral ground or mounting connector tabs in the portion of the laminate where the metal foil is exposed from the organic material along the top edge of the laminate. The blanked laminate strip is then formed into a generally cylindrical configuration with the light-colored organic material on the outer surface of the cylinder by fitting the detent flap into the slit such that the laminate material characteristics hold it pliably in a generally cylindrical configuration. The extending portions of the organic layer materials along the bottom edge of the laminate are bonded together along the edge of the metal foil at the bottom edge of the laminate to electrically isolate that edge of the metal foil. The ground tabs in the shield are then secured to selected stud means or the like extending up from the base or metering mechanism inside the transparent housing part in the power meter device for mounting the shield in the device to enclose the electronic components of the device within the shield.

In that arrangement, the bottom edge of the laminate is easily accommodated within the existing power meter device without risk that the metal foil edge at the bottom of the shield might make electrical contact with any high voltage portion of the power meter device or with an electrical circuit whose power usage is to be metered with the device. The outwardly facing white surface and inwardly facing black surface of the shield cylinder cooperate in thermally shielding the electronic components of the power meter device by reflecting some light and other radiant heat from exterior sources away from the power meter while also tending to enhance dissipation of heat which may be generated or built up within the power meter device itself. The shield is attractively colored and, where made from selected stable polyesters or the like, is adapted to retain its good color and appearance over a long service life. The metal foil in the shield is grounded in a convenient manner using existing portions of the metering mechanism or the like for electromagnetically shielding electronic components within the device. Further, the shield is adapted to be easily manufactured in power meter devices which are already installed at some locations including those which have been retrofitted with electronic components and the like for permitting remote reading of the meter devices.

DESCRIPTION OF THE DRAWINGS

Other objects, advantages and details of the novel and improved thermal and electromagnetic shield for power meter devices of this invention appear in the following detailed description of preferred embodiments of the invention, the detail description referring to the drawings in which.

DESCRIPTION OF THE PREFERRED EMBODIMENTS

Figure 1:
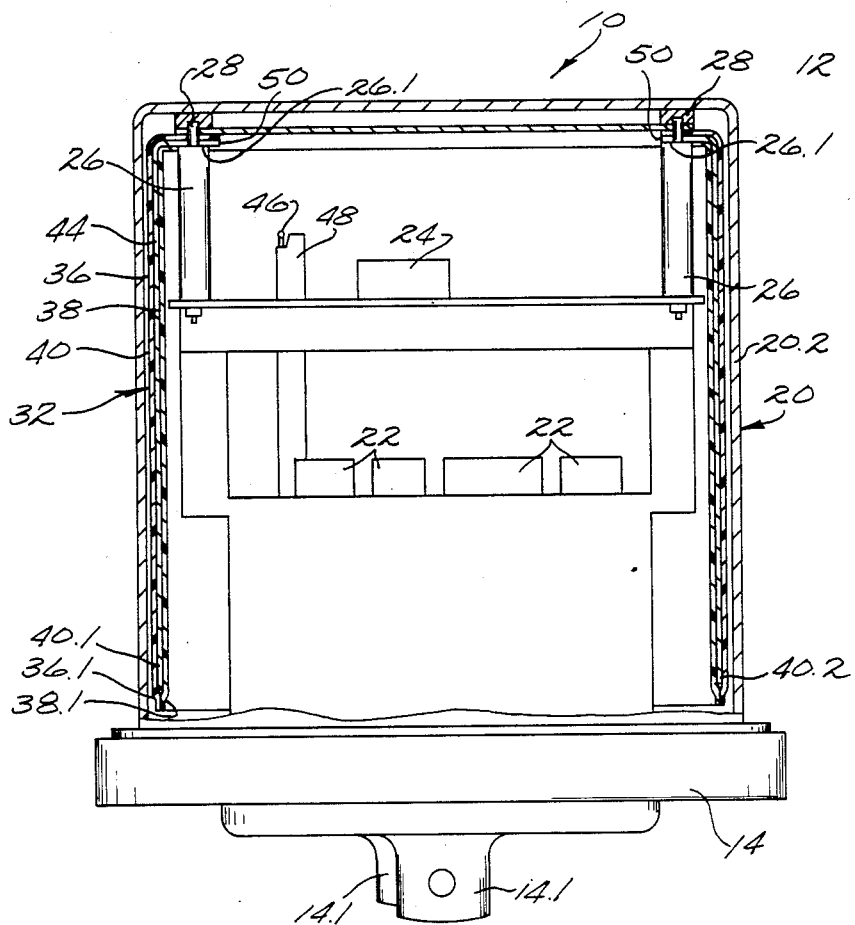
FIG. 1 is a side elevation view partly in section of a power meter device diagrammatically illustrating electronic components of the device thermally and electromagnetically shielded in the power meter device.

Referring to the drawings, 10 in FIG. 1 indicates the novel and improved power meter device of this invention which includes a conventional power meter 12 having a base 14 with a pair of support means 14.1 which serve for mounting the device in a selected location and also provide ground and power leads for connecting the meter in an electrical circuit in conventional manner. A power metering mechanism 16 is mounted on the base. As will be understood the meter is adopted for measuring power usage in the circuit in a conventional manner. A transparent part 20 of glass or a shock-resistant plastic material such as polycarbonate or the like is secured to the base in any conventional manner for enclosing the metering mechanism. Typically the conventional power meter 12 includes a display means 22 such as dials or the like for giving visual indication of power usage in the circuit as determined by the metering mechanism. In a preferred embodiment the power meter 12 includes electronic means 24 such as electronic signal transmitter components or the like for providing an electrical signal to a location remote from the power meter device 10 representative of the power usage in the circuit as determined by the metering mechanism. In one embodiment of the invention, the transparent housing part has an inverted cup-shaped cylindrical configuration with a cup bottom 20.1 and a cylindrical side wall 20.2. As the power meter 12 as thus described is conventional it is not further described herein and it will be understood that any conventional meter with a transparent housing part is within the scope of this invention. Preferably the meter has stand-off stud means 26 which are either incorporated as part of the meter for supporting a metal nameplate 27 or the like over the top of the meter mechanism or which are especially provided therein to extend up near the transparent housing bottom 20.1.

Figure 2:
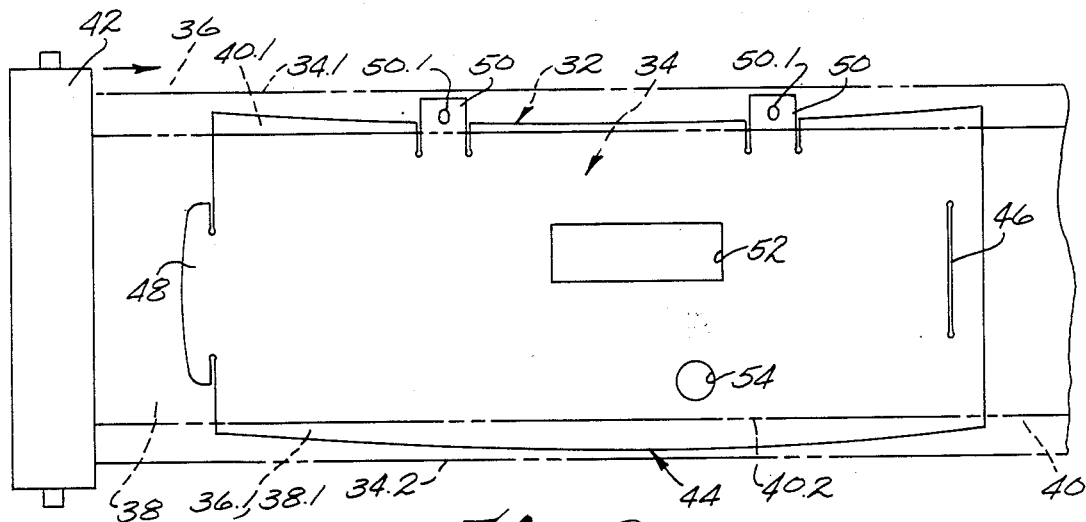
FIG. 2 is a plan view of a laminate material used in the invention illustrating steps in a preferred method for making the thermal and electromagentic shield of the invention.

In accordance with this invention, the power meter device further includes a thermal and electromagnetic interference shield 32 which is mounted around the metering mechanism 14 for shielding the mechanism 14 for shielding the mechanism from ambient environmental conditions. In a preferred embodiment, the shield comprises a metal-organic laminate 34 having a layer 36 of white or relatively light-colored, electrically-insulating, organic material such as a polyester film and a layer 38 of a black or relatively dark-colored, electrically-insulating organic material such as a polyester film which are bonded to respective opposite side surfaces of an electrically conductive metal foil 40 of aluminum or the like. If desired, the dark and light-colored organic film layers are bonded to the metal foil by use of intermediate adhesives (not shown) as will be understood or, if desired the organic films are bonded to opposite sides of the foil by hot or cold roll or pressure bonding in any conventional manner as is diagrammatically illustrated by the bonding roll 42 in FIG. 2. In accordance with the invention, at least the dark-colored organic film 38 is bonded to the metal foil to be less than fully coextensive with the foil for leaving a portion 40.1 of the foil adjacent a top edge 34.1 of the laminate exposed from the dark-colored film. Similarly, the films 36 and 38 are bonded to the metal foil so that portions 36.1 and 38.1 of the films extend from the metal foil along a bottom edge 34.2 of the laminate and are bonded to each other along that laminate edge to electrically isolate the bottom of the edge 40.2 of the metal foil. The shield is then formed from the laminate by blanking a strip or length 44 of the laminate in any conventional manner to provide the strip with a slit 46 therein near one end of the strip, with an interlock or detent flap 48 at an opposite end of the strip, and with integral ground or connector tabs 50 in the portion 40.1 of the metal foil which is exposed from the organic film along the top edge of the laminate strip. The ground tabs are provided with mounting apertures 50.1 and, if desired, the strip is also provided with openings 52, 54 for permitting observation of the visual display 22 through the shield and for permitting later access to selected portions of the meter mechanism through the shield. Preferably the laminate is formed from organic films such as a polyvinyl chloride material having a thickness of about 0.003 inches which are roll-bonded to an aluminum foil of about 0.003 inches thickness so the laminate is pliable to permit easy shaping but so that the laminate material has sufficient stiffness to be shape-retaining.

The blanked strip 44 is then formed into a cylinder having the white organic film disposed on its outer surface by fitting the interlocking detent flap 48 into the slit 46 to form the shield 32. If desired, the top and bottom edges of the laminate are slightly curved so the shield as formed has a slight taper to be slightly larger in diameter along the bottom edge of the shield. The shield is then disposed within the transparent housing part 20 around the metering mechanism 16 with the opening 52 aligned with the display means 22 and with the ground tab mounting apertures 50.1 fitted over the stud means 26 extending up from the base or metering mechanism so that the leads electrically ground the tabs and metal foil to the stud means and secure the shield in surrounding relation to the metering mechanism including the electronic transmitter means 24 within the transparent housing part. The slight taper in the shield facilitates fitting it over the meter mechanism while also permitting a snug enclosure to aid in positioning. As illustrated, the ground tabs are held by nuts 28 against shoulders 26.1 provided on the stud means. Alternately however the ground tabs are grounded and secured to other electrically grounded portions of the metering mechanism or the like either by use of existing screw means or the like or by use of self-tapping metal screws or the like attached to the metering mechanism or the base for that purpose.

In that arrangement, the shield is easily manufactured for use in presently existing or new power meter designs and is easily and economically mounted within the transparent housing parts conventionally used in such power meters and the like. On being inserted into the power meters within the transparent housing parts, the metal foil within the shield is electrically isolated along its bottom edge so there is no risk of that portion of the foil making electrical shorting contact with high voltage portions of the meter mechanism or with the electrical circuit to which the meter is connected. The connector tabs on the metal foil are easily mounted and electrically grounded and the light outer surfaces of the shield reflect sunlight and other radiant heat from outside sources while the dark inner surface of the shield tends to dissipate heat from with the heater so that the electronic components 24 shielded from temperature extremes and are adapted to display long service lives. The metal foil also provides desired electromagnetic shielding for the metering mechanism so that the electronic components 24 within the mechanism are reliable in use. The white outer surface of the shield has an attractive appearance and is adapted to retain that attractive appearance over a long service life.

It should be understood that the although particular embodiments of the power meter device and shield of this invention have been described by way of illustrating the invention, the invention includes all modifications in equivalents thereof falling within the scope of the appended claims.

I claim:

1. A power meter having a base, an electronic meter mechanism mounted on the base to be connected in an electrical circuit for metering power used in the circuit, a transparent housing part having a top and having an open bottom fitted over the meter mechanism cooperating with the base for enclosing the meter mechanism, and mounting means adapted to be electrically grounded extending up from the base into the transparent housing part, characterized in that a thermal and electromagentic interference shield is secured to the mounting means to extend around the meter mechanism within the transparent housing part for shielding the power meter from ambient environmental conditions, the shield comprising a length of a composite metal-organic laminate having layers of white and black organic materials bonded to respective opposite outer side surfaces of an electrically conductive metal foil, the shield being arranged to extend around the meter mechanism with the black and white organic materials of the laminate facing respectively toward and away from the meter mechanism for thermally shielding the power meter, the laminate having portions of the metal foil free of the organic material in the laminate electrically connected to the mounting means extending up from the base for electrically grounding the metal foil of the laminate to electromagnetically shield the power meter , the layer of black organic material in the laminate being less than fully coextensive with the metal foil leaving a portion of the metal foil exposed adjacent a top edge of the laminate, the layers of white and black organic materials extending from the metal foil and being bonded to each other along a bottom edge of the laminate for electrically insulating an edge of the foil at the bottom of the laminate, ground and mounting tabs integral with the laminate are provided in the exposed portion of the metal foil, the length of the laminate is formed into a generally cylindrical configuration with white organic material disposed on the outer surface of the cylinder and opposite ends of the laminate length are secured together, and the tabs are secured in electrically conductive engagement with the mounting means for disposing and electrically grounding the shield around the meter mechanism within the transparent housing part.

2. A power meter according to claim 1 further characterized in that the laminate material in the shield is pliable and shape-retaining and the shield is formed from a strip of the laminate material having a slit adjacent one strip end and a detent flap at the opposite strip end, the detent flap being detachably fitted into the slit for securing the strip in said generally cylindrical configuration extending circumferentially around the meter mechanism.

3. A power meter according to claim 2 wherein the meter mechanism has visual display means and the shield is apertured for permitting viewing of the display means.

4. A power meter according to claim 3 wherein the metal foil is aluminum and the organic layer material are matte-finished polyesters.

5. A thermal and electromagnetic interference shield particularly for use with a power meter device and the like having a transparent housing part for enclosing selected components of the device within the transparent housing part, the shield comprising a strip of composite metal-organic laminate having layers of white and black organic material bonded to respective opposite outer surfaces of an electrically conductive metal foil, the laminate strip having its opposite ends secured together to form a generally cylindrical configuration having the black and white organic layers of the laminate facing respectively inward and outward of the cylinder for thermally shielding components of the device disposed within the cylinder, the layer of at least the black organic material being less than fully coextensive with the metal foil adjacent one edge shield cylinder leaving a portion of metal foil exposed, that portion of the foil having integral tabs formed therein for electrically connecting the metal foil to electrical ground to electromagnetically shield components of the device disposed within the cylinder, and the layers of white and black organic material extending from the foil and being bonded together along an opposite edge of the shield for otherwise electrically isolating said edge of the metal foil in the shield.

6. A method for making a thermal and electromagnetic interference shield particularly for use with a power meter device and the like having a transparent housing part comprising the steps of bonding layers of white and black organic materials to respective opposite outer surfaces of an electrically conductive metal foil to form a composite metal-organic metal laminate such that at least a layer of black organic material is less than fully coextensive with the metal foil leaving a first portion of the metal foil exposed adjacent a first edge of the laminate and such that the layers of white and black organic material extend from the metal foil and are bonded together along an opposite edge of the laminate, blanking a strip of that composite metal-organic laminate to provide integral tabs of the metal foil in said first portion of the metal foil for electrically grounding the metal foil, and securing opposite ends of the strips of laminate material together to form a cylinder having the black and white organic layer materials facing respectively inward and outward of the cylinder.

* * * * *